(12) United States Patent
Lai et al.

(10) Patent No.: US 8,502,539 B2
(45) Date of Patent: Aug. 6, 2013

(54) GRADIENT AMPLIFIER SYSTEM

(75) Inventors: Rixin Lai, Clifton Park, NY (US); Luis Jose Garces, Niskayuna, NY (US); Juan Antonio Sabate, Gansevoort, NY (US); Juan Manuel Rivas Davila, Niskayuna, NY (US); Song Chi, Clifton Park, NY (US); Wesley Michael Skeffington, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 307 days.

(21) Appl. No.: 13/076,823

(22) Filed: Mar. 31, 2011

(65) Prior Publication Data

US 2012/0249145 A1    Oct. 4, 2012

(51) Int. Cl.
*G01V 3/00* (2006.01)

(52) U.S. Cl.
USPC .......................................... 324/318; 324/309

(58) Field of Classification Search
USPC ........................ 324/300–322; 600/407–445
See application file for complete search history.

(56) References Cited

U.S. PATENT DOCUMENTS

| | | | |
|---|---|---|---|
| 6,166,602 A | 12/2000 | Steigerwald et al. | |
| 6,198,282 B1 | 3/2001 | Dumoulin | |
| 6,323,649 B1 | 11/2001 | Pace et al. | |
| 6,501,977 B1 * | 12/2002 | Kimmlingen | 600/410 |
| 6,531,870 B2 * | 3/2003 | Heid et al. | 324/318 |
| 6,671,329 B1 | 12/2003 | Lenz | |
| 6,671,330 B1 | 12/2003 | Lenz et al. | |
| 6,700,803 B2 | 3/2004 | Krein | |
| 6,900,638 B1 * | 5/2005 | Yair et al. | 324/322 |
| 7,068,097 B2 | 6/2006 | Atmur | |
| 7,116,166 B2 | 10/2006 | Sabate et al. | |
| 7,253,625 B2 | 8/2007 | Trabbic et al. | |
| 7,336,059 B2 | 2/2008 | Steigerwald et al. | |
| 7,423,894 B2 | 9/2008 | Ilic | |
| 7,639,015 B2 | 12/2009 | Thuringer et al. | |
| 7,714,583 B2 | 5/2010 | Zhu et al. | |
| 7,778,324 B2 | 8/2010 | Stanley | |
| 2006/0152222 A1 | 7/2006 | Trabbic et al. | |
| 2010/0034002 A1 | 2/2010 | Ilic | |

FOREIGN PATENT DOCUMENTS

EP            977348 B1    3/2009

* cited by examiner

*Primary Examiner* — Brij Shrivastav
(74) *Attorney, Agent, or Firm* — Seema S. Katragadda

(57) ABSTRACT

A gradient amplifier system is presented. An embodiment of a gradient amplifier system that includes a power stage having a plurality of bridge amplifiers, where each of the plurality of bridge amplifiers operates at a first switching frequency. The gradient amplifier system further includes a gradient coil coupled to an output terminal of the power stage and configured to produce a magnetic field proportional to a coil current signal supplied by the power stage. In addition, the gradient amplifier system includes a controller stage coupled to an input terminal of the power stage and configured to generate a pulse width modulated gate signal based on the coil current signal and a reference current signal, where the pulse width modulated gate signal is generated at a second switching frequency upon occurrence of a slew rate associated with the reference current signal is below a determined threshold rate and an amplitude level associated with the reference current signal is above a determined level. Further, the controller stage is configured to apply the generated pulse width modulated gate signal to the power stage for changing an operating frequency of each of the plurality of bridge amplifiers from the first switching frequency to the second switching frequency.

25 Claims, 8 Drawing Sheets

GRADIENT AMPLIFIER SYSTEM

BACKGROUND

The invention relates generally to magnetic resonance imaging (MRI) systems and more specifically to a gradient amplifier system adapted for use in MRI systems.

In just a few decades, the use of magnetic resonance imaging (MRI) scanners has grown tremendously. MRI scans are being increasingly used to aid in the diagnosis of multiple sclerosis, brain tumors, torn ligaments, tendonitis, cancer, strokes, and the like. As will be appreciated, MRI is a noninvasive medical test that aids physicians in the diagnoses and treatment of various medical conditions. The enhanced contrast that an MRI scan provides between the different soft tissues of the body allows physicians to better evaluate the various parts of the body and determine the presence of certain diseases that may not be assessed adequately with other imaging methods such as X-ray, ultrasound, or computed tomography (CT).

A conventional MRI system typically establishes a homogenous magnetic field generally along a central axis of a subject undergoing an MRI procedure. This homogeneous magnetic field affects the gyro magnetic material of the subject for imaging by aligning the nuclear spins, in atoms and molecules forming the body tissue. For example, in medical applications, the nuclear spins are aligned along the direction of the magnetic field. If the orientation of the nuclear spins is perturbed out of alignment with the magnetic field, the nuclei attempt to realign their spins with the field. Perturbation of the orientation of nuclear spins is typically caused by application of radio frequency (RF) pulses tuned to the Larmor frequency of the material of interest. During the realignment process, the nuclei precess about their axes and emit electromagnetic signals that may be detected by one or more RF detector coils placed on or about the subject.

The frequency of the magnetic resonance (MR) signal emitted by a given precessing nucleus depends on the strength of the magnetic field at the location of the nucleus. It is possible to distinguish signals originating from different locations within the subject by using encoding, typically phase and frequency encoding, created by gradient coils that apply gradient fields over the main magnetic field. A typical MRI system includes three gradient coils for providing respective fields along the X, Y and Z axes. Control of the gradient coils allows for orientation of the axes for encoding of locations within the subject, and for selection of a desired "slice" for imaging.

Furthermore, these gradient coils typically produce additional magnetic fields that are superimposed on the primary magnetic field to permit localization of the image slices and also provide phase encoding and frequency encoding. This encoding permits identification of the origin of resonance signals during image reconstruction. The image quality and resolution depends significantly on how the applied fields can be controlled. To achieve faster imaging rates, the gradient fields are typically modified at frequencies of several kHz. Control of the gradient coils is generally performed in accordance with pre-established protocols or sequences, called pulse sequence descriptions, permitting many types of tissues to be imaged and distinguished from other tissues in a medical context, or for imaging various features of interest in other applications.

Typically, a gradient coil operates at about 500 amperes of current and at a voltage in a range from about 1000 volts to about 2000 volts. Therefore, it is desirable to provide a gradient amplifier that is configured to supply the gradient coils with the desired current and voltage levels. In certain embodiments, the gradient amplifier is a power amplifier.

Earlier implementations of gradient amplifiers used linear amplifiers that provided high fidelity. However, given present power level requirements, the use of these amplifiers becomes impractical due to need for the higher voltages and currents. Present day techniques use hybrid systems that combine linear amplifiers with switching power stages. Such systems use bridges in parallel or bridges stacked to meet the system requirements, and typically employ power semiconductor devices. However, in the conventional gradient amplifier system, each of the bridges has different direct current (DC) link voltages and different voltage commands, which unfortunately results in different switching frequencies for each of the bridges. Since each of the bridges operates at different switching frequencies with different DC link voltages, there is significant power loss in the gradient amplifier system. Moreover, the power loss increases when a low voltage is desired across the gradient coil. In addition, the power losses are unevenly distributed across the bridges, and the loading on each bridge is also different, causing intense thermal stress on the gradient amplifiers.

It is therefore desirable to develop a design of a gradient amplifier system that reduces power loss. Particularly, it is desirable to develop the design of a controller stage and a power stage architecture in the gradient amplifier system that provides high power and delivers high fidelity with reduced power loss and cost through circuit topologies and control mechanisms.

BRIEF DESCRIPTION

Briefly in accordance with one aspect of the technique, a gradient amplifier system is presented. The gradient amplifier system includes a power stage that includes a plurality of bridge amplifiers, where each of the plurality of bridge amplifiers operates at a first switching frequency. The gradient amplifier system further includes a gradient coil coupled to an output terminal of the power stage and configured to produce a magnetic field proportional to a coil current signal supplied by the power stage. In addition, the gradient amplifier system includes a controller stage coupled to an input terminal of the power stage and configured to generate a pulse width modulated gate signal based on the coil current signal and a reference current signal, where the pulse width modulated gate signal is generated at a second switching frequency upon occurrence of a slew rate associated with the reference current signal is below a determined threshold rate and an amplitude level associated with the reference current signal is above a determined level. Further, the controller stage is configured to apply the generated pulse width modulated gate signal to the power stage for changing an operating frequency of each of the plurality of bridge amplifiers from the first switching frequency to the second switching frequency.

In accordance with a further aspect of the present technique, a method for controlling a gradient amplifier system is presented. The method includes receiving a coil current signal from an output terminal of a power stage that includes a plurality of bridge amplifiers operating at a first switching frequency. Also, the method includes receiving a reference current signal for controlling a magnetic field across a gradient coil. The method further includes generating a pulse width modulated gate signal based on the coil current signal and the reference current signal, where the pulse width modulated gate signal is generated at a second switching frequency when a slew rate associated with the reference current signal is below a determined threshold rate and an amplitude level associated with the reference current signal is above a determined level. The method also includes applying the pulse width modulated gate signal to the power stage for changing an operating frequency of each of the plurality of bridge amplifiers from the first switching frequency to the second switching frequency.

In accordance with another aspect of the present technique, a controller stage for controlling a gradient amplifier system is presented. The controller stage includes a command generator configured to generate a voltage command signal based on a coil current signal and a reference current signal. In addition, the controller stage includes an analyzer configured to determine a slew rate and an amplitude level associated with the reference current signal. The controller stage also includes a pulse width modulator coupled to the command generator and the analyzer and configured to modulate the voltage command signal based on the slew rate and the amplitude level associated with the reference current signal.

In accordance with yet another aspect of the present technique, a system for magnetic resonance imaging is presented. The system includes a scanner control circuitry configured to acquire image data. The scanner control circuitry further includes a gradient coil configured to produce magnetic fields for localizing the imaging data. The scanner control circuitry also includes a gradient amplifier system coupled to the gradient coil and configured to supply a coil current signal to the gradient coil. Further, the gradient amplifier system includes a power stage comprising a plurality of bridge amplifiers, where each of the plurality of bridge amplifiers operates at a first switching frequency. The gradient amplifier also includes a controller stage coupled to an input terminal of the power stage and configured to generate a pulse width modulated gate signal based on the coil current signal and a reference current signal, where the pulse width modulated gate signal is generated at a second switching frequency when a slew rate associated with the reference current signal is below a determined threshold rate, and an amplitude level associated with the reference current signal is above a determined level. Further, the controller stage is configured to apply the generated pulse width modulated gate signal to the power stage for changing an operating frequency of each of the plurality of bridge amplifiers from the first switching frequency to the second switching frequency. The system also includes system control circuitry in operative association with the scanner control circuitry and configured to process the acquired image data.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As will be described in detail hereinafter, various embodiments of an exemplary gradient amplifier system for use in magnetic resonance imaging (MRI) systems and methods for controlling the gradient amplifier system are presented. By employing the methods and gradient amplifier system described hereinafter, power loss and thermal stress may be substantially reduced in the MRI systems. Some conventional systems employed different voltages and different frequencies such that upon certain conditions, the voltages and frequencies changes. In one example, the system operates at a single frequency and upon certain conditions the frequency is changed to manage losses.

Figure 1:
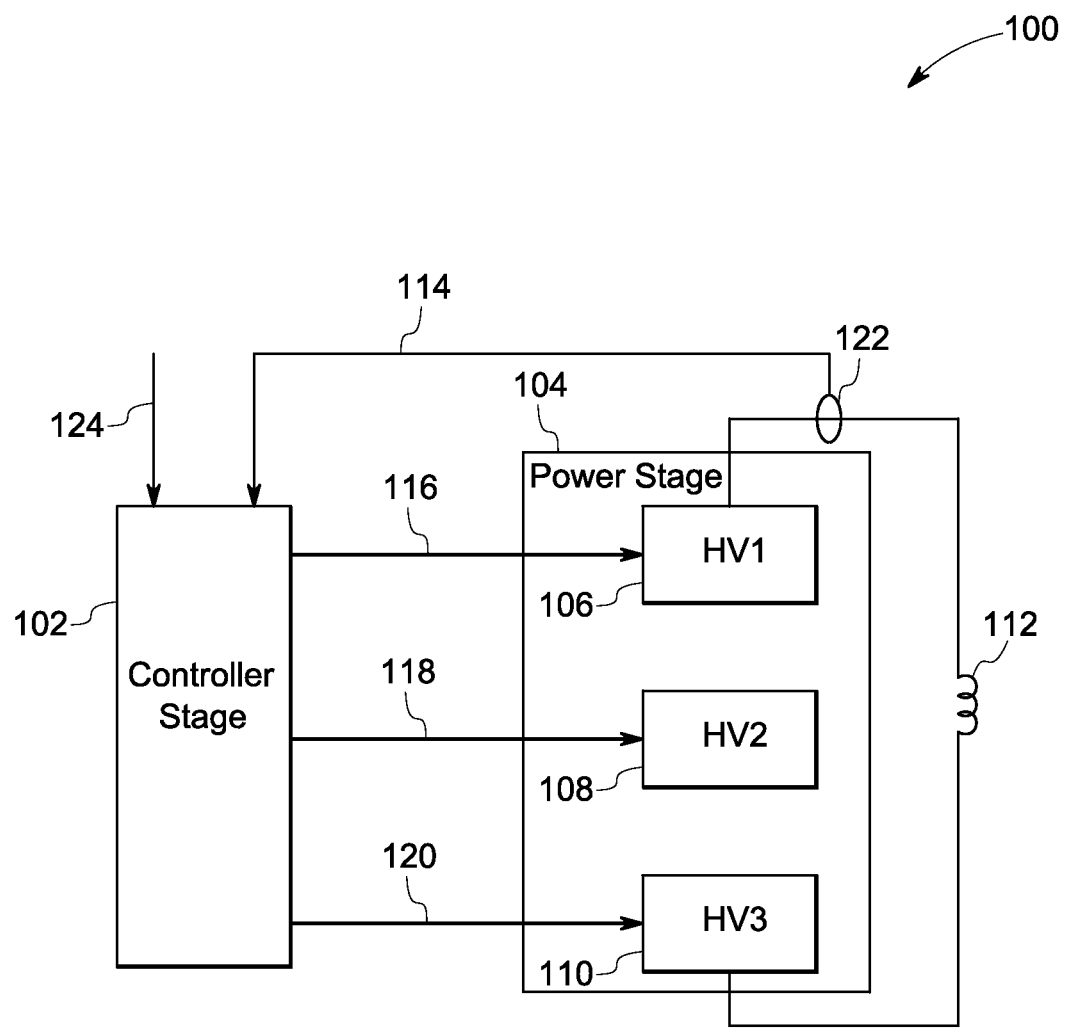
FIG. 1 is a diagrammatical illustration of a gradient amplifier system, in accordance with aspects of the present technique.

Turning now to the drawings, and referring to FIG. 1, a diagrammatical illustration of an exemplary gradient amplifier system 100 for use in an MRI system, in accordance with aspects of the present technique, is depicted. The gradient amplifier system 100 is illustrated diagrammatically as including a controller stage 102, a power stage 104, and a gradient coil 112. The functioning of each component will be described in greater detail with reference to FIGS. 1-8. As used herein, the term "power stage" is used to refer to a power amplifier for generating a current that in one example has a value in a range from about 0 amperes to about 500 amperes and a voltage having a value in a range from about 0 volts to about 2000 volts to drive the gradient coil 112 at a desired range. In one embodiment, the power stage 104 may generate a current having a value that is more than 500 amperes and a voltage having a value that is more than 2000 volts. Similarly, the term "controller stage" is used to refer to a controller/processor that is configured to control or regulate an amplitude level and a frequency of a voltage signal provided to the gradient coil 112.

As will be appreciated, an MRI system typically includes one or more gradient coils, such as the gradient coil 112, where each gradient coil 112 is driven by a corresponding power stage 104. The gradient coils 112 are typically used to alter a primary magnetic field of the MRI system by creating gradient fields at frequencies such as up to several kilohertz to facilitate fast imaging. Typical inductance levels in the gradient coil 112 in one example may be in a range from about hundreds of µH to about 1 mH. Also, typical voltage levels in the gradient coil 112 in one example may be in a range from about 1000 volts to about 2000 volts, while the current levels in the gradient coil 112 may be in a range from about 0 amperes to about 500 amperes. While the embodiments described hereinafter refer to MRI system applications, use of the present techniques in other applications that entail use of high voltage and high current at very high fidelity are also envisaged.

In a presently contemplated configuration, the gradient coil 112 is coupled to an output terminal of the power stage 104. In addition, the gradient coil 112 is configured to produce a magnetic field proportional to a coil current signal 114 received from the power stage 104. As used herein, the term "coil current signal" is used to refer to a current that is supplied by the power stage 104 to the gradient coil 112 to induce a desired magnetic field across the gradient coil 112.

Figure 4:
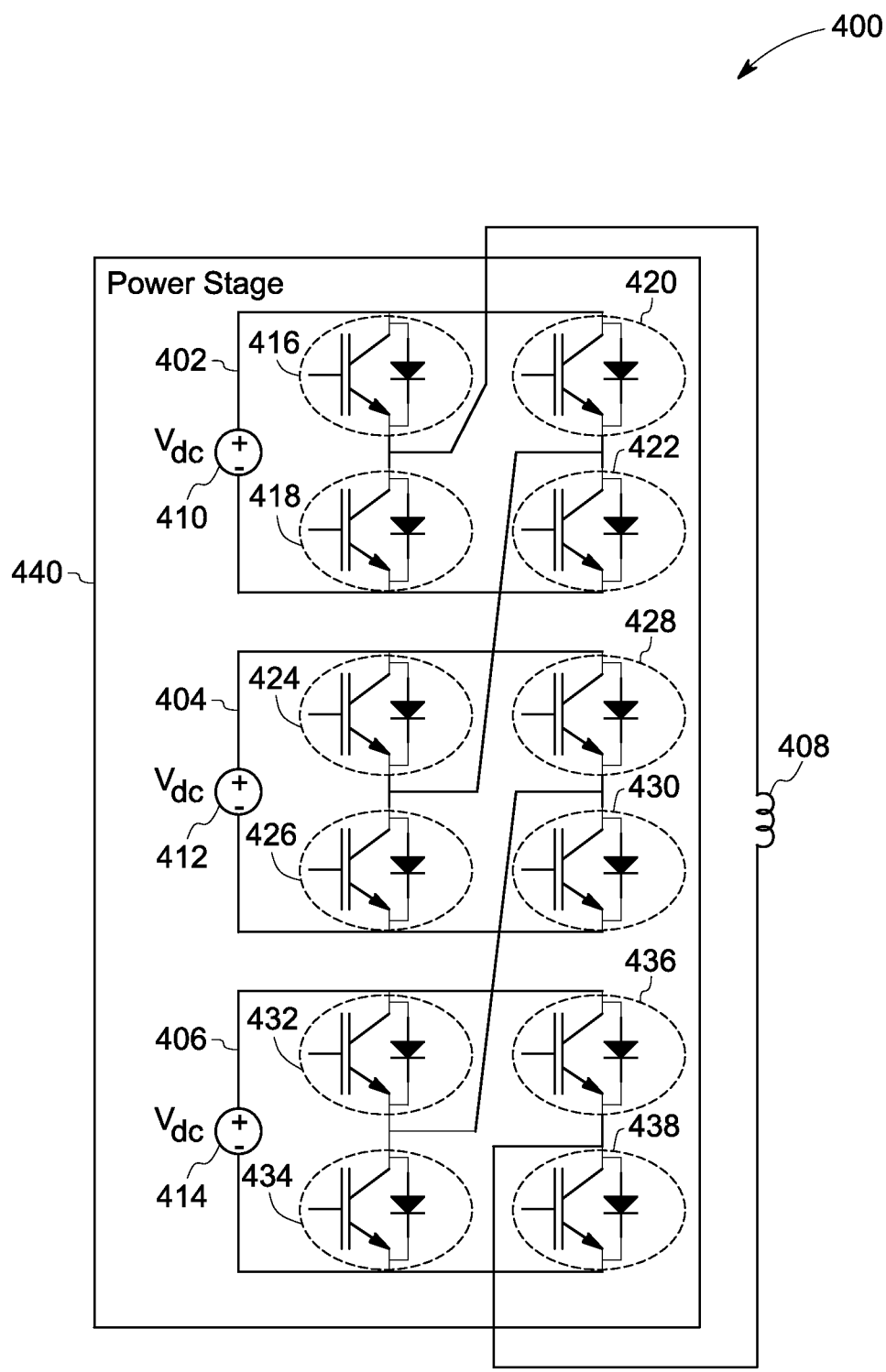
FIG. 4 is a schematic representation of the power stage of FIG. 2, in accordance with aspects of the present technique.

Further, the power stage 104 includes a plurality of bridge amplifiers. Particularly, in a presently contemplated configuration, the power stage 104 includes a first bridge amplifier 106, a second bridge amplifier 108, and a third bridge amplifier 110 that are coupled in series with each other. Although the present embodiment of the power stage 104 is described with reference to the three bridge amplifiers 106, 108, 110, it may be noted that the power stage 104 may include other numbers of bridge amplifiers in the power stage 104. Moreover, in one embodiment, each bridge amplifier may be a full bridge amplifier with a left leg and a right leg as depicted in FIG. 4. Additionally, each bridge amplifier may include a direct-current (DC) voltage source and a transistor module (not shown), and will be described in greater detail with reference to FIG. 4.

Moreover, an input terminal of the power stage 104 in this depicted example is coupled to an output terminal of the controller stage 102. The controller stage 102 controls the operation of the power stage 104 by communicating necessary control signals to the power stage 104. Particularly, the controller stage 102 transmits pulse width modulated gate signals 116, 118, 120 to the power stage 104 for controlling an operating frequency of each of the bridge amplifiers 106, 108, 110. As used herein, the term "operating frequency" is used to refer to a frequency that is employed for switching the bridge amplifiers ON and OFF. In one embodiment, there is a single switching operating frequency. By appropriately switching the bridge amplifiers 106, 108, 110 between the ON and OFF states, various intermediate and combined voltages are achieved at the output of the power stage 104. According to one embodiment, under certain conditions such as thermal, slew rate, and/or amplitude issues, the frequency of the pulse width modulation can be changed by the controller in order to regulate the system performance.

In the embodiment illustrated in FIG. 1, the controller stage 102 receives as inputs, a reference current signal 124 and the coil current signal 114. Particularly, the reference current signal 124 may be received from an external source, such as a host computer (not shown in FIG. 1). The reference current signal 124 is employed to generate the pulse width modulated gate signal. Thereafter, the generated pulse width modulated gate signal is used to control the gradient magnetic field across the gradient coil 112. Specifically, in one embodiment, the gradient magnetic field is controlled based on a slew rate and an amplitude level associated with the reference current signal 124. The term "slew rate" is used to refer to a rate at which the amplitude of the reference current signal 124 is varied with respect to time.

Additionally, the coil current signal 114 is provided as a feedback signal from the output terminal of the power stage 104 to the controller stage 102 to facilitate stable operation of the gradient amplifier system 100. Specifically, the feedback signal (coil current signal) 114 is employed to stabilize the power delivered to the gradient coil 112. To that end, in one embodiment, a current sensor 122 is disposed at a node that connects the output terminal of the power stage 104 to the gradient coil 112. The current sensor 122 senses the coil current signal 114 and communicates the sensed coil current signal 114 to the controller stage 102 as the feedback signal.

Figure 2:
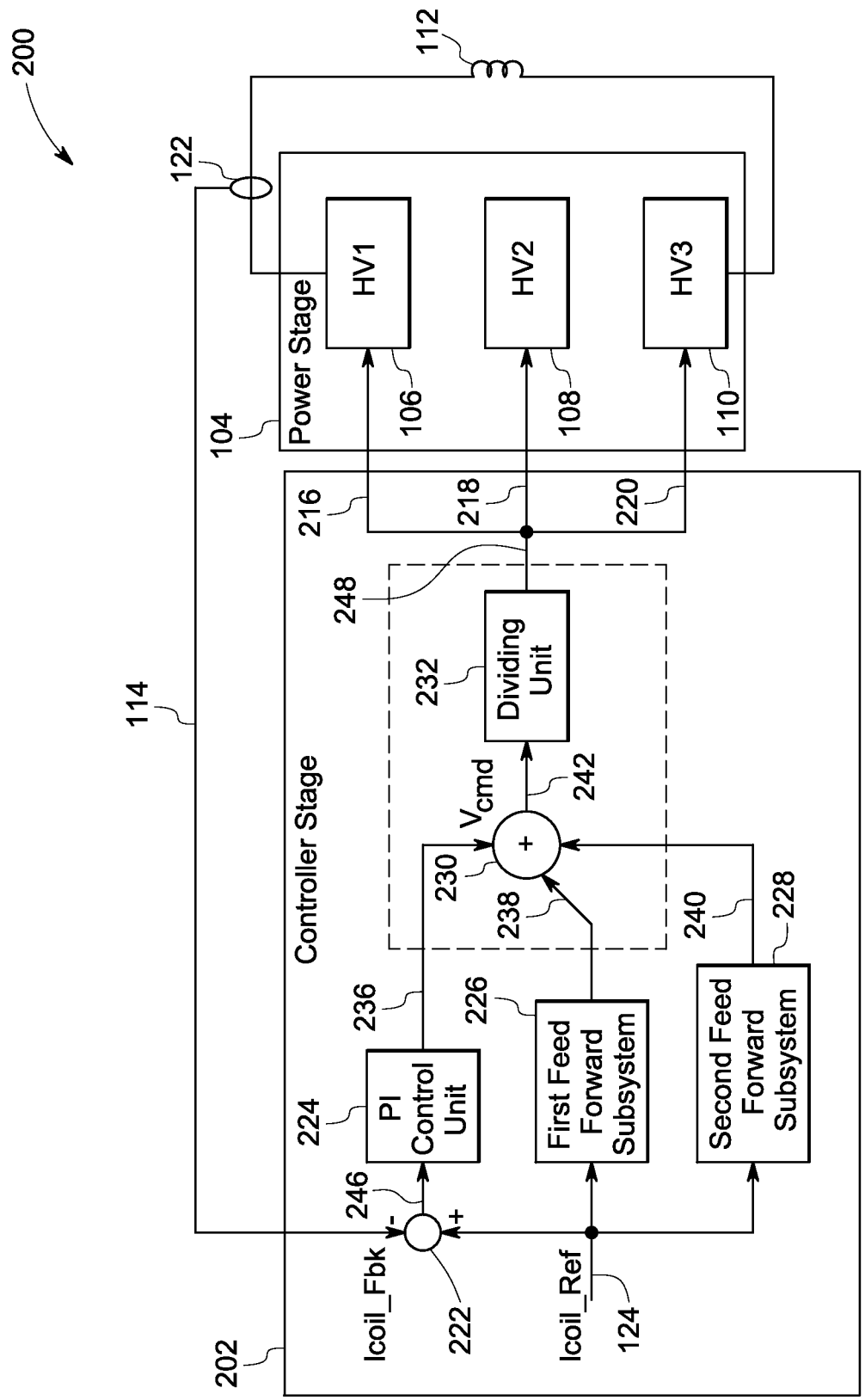
FIG. 2 is a diagrammatical illustration of an exemplary controller stage and a power stage of the gradient amplifier system of FIG. 1, in accordance with aspects of the present technique.

FIG. 2 is a diagrammatical representation of one embodiment 200 of the exemplary gradient amplifier system 100 of FIG. 1. Particularly, the gradient amplifier system 200 includes a controller stage 202 and a power stage such as the power stage 104 of FIG. 1.

In one embodiment, the controller stage 202 includes a comparator 222 that is coupled to an input terminal of a proportional integral (PI) control unit 224. The comparator 222 identifies an error current signal 246 by comparing the feedback coil current signal 114 with the reference current signal 124. The error current signal 246 may be indicative of a deviation of the coil current signal 114 from the reference current signal 124. It is desirable to reduce the deviation of the coil current signal 114 to maintain the stability or stable operation of the gradient amplifier system 200. The error current signal 246 so generated is provided to the input terminal of the PI control unit 224. Furthermore, the PI control unit 224 generates a PI voltage 236 corresponding to the error current signal 246. In addition, the PI control unit 224 may also aid in progressively minimizing the error current signal 246, thereby enhancing the transient response of the system 200.

In accordance with aspects of the present technique, the controller stage 202 further includes a first feed forward subsystem 226. The first feed forward subsystem 226 determines an inductance voltage drop 238 across the gradient coil 112. The controller stage 202 also includes a second feed forward subsystem 228. The second feed forward subsystem 228 determines a resistive voltage drop 240 across the gradient coil 112. In one embodiment, the combination of the first feed forward subsystem 226 and the second feed forward subsystem 228 may be represented as a coil model unit. This coil model unit may be employed in the controller stage 202 to determine the inductive and resistive voltage drops 238, 240 across the gradient coil 112.

Additionally, in one embodiment, the controller stage 202 includes a summing unit 230 that sums the PI voltage 236, the inductive voltage 238, and the resistive voltage 240 received at an input terminal, and provides a voltage command signal $V_{cmd}$ 242 at an output terminal of the summing unit 230. Further, the voltage command signal $V_{cmd}$ 242 is provided to a dividing unit 232 that divides the voltage command signal $V_{cmd}$ 242 based on a number of bridge amplifiers in the power stage 104. For example, if the power stage 104 includes three bridge amplifiers, such as the bridge amplifiers 106, 108, 110 then the voltage command signal $V_{cmd}$ 242 is divided into three equal parts. Accordingly, one third of the voltage command signal $V_{cmd}$ 242 is applied to each of the bridge amplifiers 106, 108, 110 in the power stage 104.

Furthermore, in accordance with aspects of the present technique, one unit of the divided voltage command signal $V_{cmd}$ 242 is modulated according to a pulse width modulation scheme to generate a pulse width modulated gate signal 248. The pulse width modulated gate signal 248 is generated at a frequency based on a slew rate and an amplitude level of the reference current signal 124. Particularly, in one embodiment, the pulse width modulated gate signal 248 may be generated at a first switching frequency if the slew rate of the reference current signal 124 is above a determined threshold rate. However, if the slew rate of the reference current signal 124 is below the determined threshold rate, the pulse width modulated gate signal 248 may also be generated at the first switching frequency if the amplitude level of the reference current signal 124 is below a determined level.

In a similar manner, the pulse width modulated gate signal 248 may be generated at a second switching frequency upon occurrence of the slew rate associated with the reference current signal 124 is below the determined threshold rate and the amplitude level of the reference current signal 124 is above the determined level. In one embodiment, the second switching frequency is maintained at a value less than a value of the first switching frequency to reduce power loss and thermal stress in the system 200. In accordance with another embodiment, a control logic module (not shown in FIG. 2) having pre-programmed instructions/codes may be employed to generate the pulse width modulated gate signal 248 according to a pulse width modulation scheme.

With continuing reference to FIG. 2, the generated pulse width modulated gate signal 248 is then separately applied to each bridge amplifier, via their corresponding paths 216, 218, 220. The pulse width modulated gate signal 248 is employed to control an operating frequency of each of the bridge amplifiers 106, 108, 110. In accordance with exemplary aspects of the present technique, since a substantially similar pulse width modulated gate signal 248 is applied to each bridge amplifier, each of the bridge amplifiers 106, 108, 110 operates at a substantially similar frequency at any instant of time. By way of example, initially if the bridge amplifiers 106, 108, 110 are operating at a higher first switching frequency and a pulse width modulated gate signal having a lower second switching frequency is applied to the power stage 104, the operating frequency of each of the bridge amplifiers 106, 108, 110 changes from the higher first switching frequency to the lower second switching frequency. This change in switching frequency aids in significantly reducing the conduction loss and switching loss in the system 200.

In addition to operating the bridge amplifiers at substantially similar switching frequencies, the DC voltage sources (see FIG. 4) coupled to the bridge amplifiers are also configured to supply a substantially similar DC voltage to a corresponding bridge amplifier. This supply of substantially similar voltages to the bridge amplifiers results in an even distribution of power loss in the system 200. Also, since substantially similar bridge amplifiers and DC voltage sources are employed, design and manufacturing constraints are substantially reduced. Consequently, cost of designing and manufacturing the system 200 is also significantly reduced.

Figure 3:
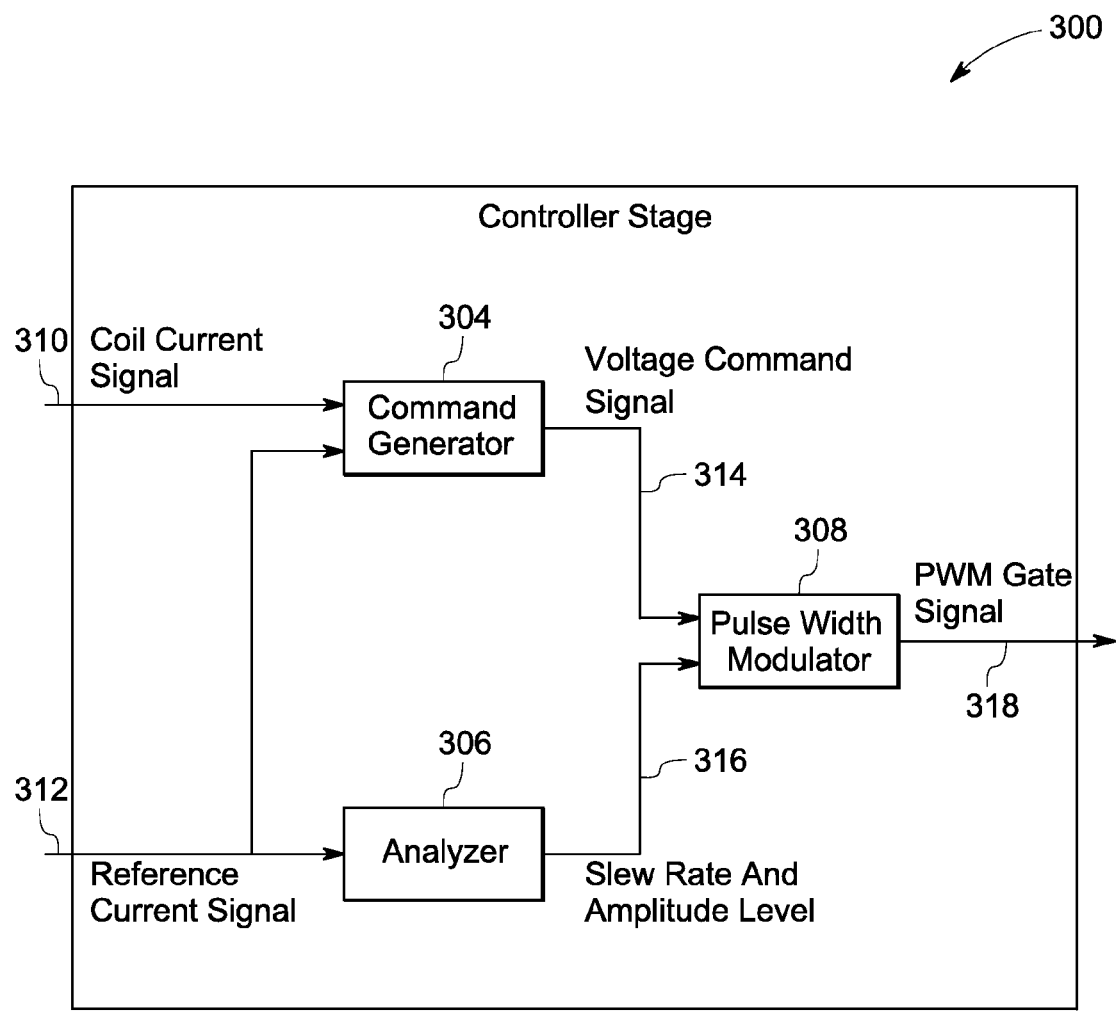
FIG. 3 is a block diagram representation of the controller stage of FIG. 2, in accordance with aspects of the present technique.

Referring now to FIG. 3, a block diagram representation 300 of one embodiment of the controller stage 202 of FIG. 2 is depicted. In a presently contemplated configuration, the controller stage 300 includes a command generator 304, an analyzer 306, and a pulse width modulator 308. The command generator 304, in one embodiment, may include a combination of subunits such as the comparator unit 222, the PI control unit 224, the first feed forward subsystem 226, the second feed forward subsystem 228, and the summing unit 230 of FIG. 2.

In accordance with aspects of the present technique, the command generator 304 receives a coil current signal 310 and a reference current signal 312 at an input terminal. Furthermore, the command generator 304 generates a voltage command signal 314 at an output terminal. Particularly, the command generator 304 generates the voltage command signal 314 based on the received coil current signal 310 and the reference current signal 312. In accordance with another embodiment, the command generator 304 may include a processor (not shown in FIG. 3) that stores instructions to aid in the generation of the voltage command signal 314 based on the coil current signal 310 and the reference current signal 312. Moreover, the generated voltage command signal 314 may be supplied to the pulse width modulator 308. The pulse width modulator 308 is configured to modulate the voltage command signal 314 according to a determined pulse width modulation scheme.

The analyzer 306 receives the reference current signal 312, and determines a slew rate and an amplitude level associated with the reference current signal 312. In accordance with another embodiment, the analyzer 306 may include a processor (not shown in FIG. 3) that stores instructions to aid in determining the slew rate and the amplitude level associated with the reference current signal 312. Furthermore, in certain embodiments, the slew rate and the amplitude level of the reference current signal 312 may be determined concurrently with the generation of the pulse width modulated gate signal. Alternatively, the slew rate and the amplitude level of the reference current signal 312 may also be determined before or after the generation of the voltage command signal 314. Also, information 316 associated with the determined slew rate and the amplitude level of the reference current signal 312 is communicated to the pulse width modulator 308. In addition, the voltage command signal 314 is also provided as an input to the pulse width modulator 308.

Furthermore, the pulse width modulator 308 generates a pulse width modulated gate signal 318. In particular, the pulse width modulator 308 is configured to generate the pulse width modulated gate signal 318 at a frequency that is based on the information 316 associated with slew rate and the amplitude level of the reference current signal 312. Specifically, the pulse width modulated gate signal 318 may be generated at a first switching frequency if the slew rate of the reference current signal 312 is above a determined threshold rate. In addition, the pulse width modulated signal 318 may also be generated at the first switching frequency if the slew rate of the reference signal is below the threshold rate and the amplitude level of the reference current signal 312 is below a determined level.

Alternatively, the pulse width modulated gate signal 318 may be generated at a second switching frequency if the slew rate of the reference signal is below the threshold rate and the amplitude level of the reference current signal 312 is above the determined level. It may be noted that in certain embodiments, the second switching frequency is less than the first switching frequency so as to reduce power loss and thermal stress in the gradient amplifier system 200 (see FIG. 2). For example, when a low voltage is desired across the gradient coil such as the gradient coil 112 (see FIG. 2), the operating frequency of each bridge amplifier, such as the bridge amplifiers 106, 108, 110 (see FIG. 2), is changed from the higher first switching frequency to the lower second switching frequency. This change in operating frequency of each of the bridge amplifiers facilitates significant reduction in switching loss and conduction loss in the gradient amplifier system 200.

FIG. 4 is a schematic representation of one embodiment 400 of a power stage 440 such as the power stage 104 (see FIG. 1) configured to drive a gradient coil 408, such as the gradient coil 112 (see FIG. 1), in accordance with aspects of the present technique. In a presently contemplated configuration, the power stage 440 includes three bridge amplifiers 402, 404, 406 that are coupled in series. In one embodiment, these bridge amplifiers 402, 404, 406 may be representative of the bridge amplifiers 102, 104, 106 of FIG. 1. The bridge amplifiers 402, 404, 406 are further coupled in series with the gradient coil 408. Moreover, in one embodiment, the bridge amplifiers 402, 404, 406 have substantially similar topologies. A first DC voltage source 410 is coupled across the first bridge amplifier 402, a second DC voltage source 412 is coupled across the second bridge amplifier 404, and a third DC voltage source 414 is coupled across the third bridge amplifier 406. Each of the DC voltage sources 410, 412, 414 is configured to supply a substantially similar DC voltage across the corresponding bridge amplifier. By way of example, if it is desirable to supply a DC voltage of about 800 volts, then each of the DC voltage sources 410, 412, 414 supplies a DC voltage of about 800 volts to the corresponding bridge amplifier.

In accordance with further aspects of the present technique, the first bridge amplifier 402 includes transistor modules 416, 418, 420, 422, in one embodiment. These transistor modules may be of any suitable type of solid state switching device, such as insulated gate bipolar junction transistors (IGBTs), metal oxide semiconductor field effect transistors (MOSFETs), and the like. Particularly, the transistor modules 416 and 422 are connected in series to form a first leg or left leg of the first bridge amplifier 402. Similarly, transistor modules 418 and 420 are connected in series to form a second leg or right leg of the bridge amplifier 402. The first and second legs of the first bridge amplifier 402 are connected in parallel. It may be noted that, either one of the legs may be configured to operate as an input terminal while the other leg may be configured to operate as an output terminal of the first bridge amplifier 402. In a similar manner, the second bridge amplifier 404 includes a first leg having transistor modules 424 and 430, and a second leg having transistor modules 426 and 428. Further, the third bridge amplifier 406 includes a first leg having transistor modules 432 and 438, and a second leg having transistor modules 434 and 436.

Further, the transistor modules in each of the bridge amplifiers 402, 404, 406 are configured to be switched ON or OFF based on the pulse width modulated gate signal provided by the controller stage, as depicted in FIG. 2. By way of example, in the first bridge amplifier 402, a pulse width modulated gate signal is applied to a base terminal of the transistors modules 416 and 422 during a time period $T_1$. Particularly, during the time period $T_1$, the left leg transistor modules 416 and 422 are energized to an ON state, while the right leg transistor modules 418, 420 remain in an OFF state. Similarly, the pulse width modulated gate signal is applied to a base terminal of the transistors modules 418 and 420 during a subsequent time period $T_2$. Thus, during the time period $T_2$, the right leg transistor modules 418 and 420 are switched to an ON state, while the left leg transistor modules 416 and 422 are switched to an OFF state. Since each leg of the first bridge amplifier 402 switches ON and OFF during a respective time period/duty cycle, the output voltage of the first bridge amplifier 402 is a modulated output voltage signal.

In addition, since each bridge amplifier includes at least two legs and each leg is conducting during a respective time period/duty cycle, the frequency of the modulated output voltage signal at each bridge amplifier is at least twice the frequency of the applied pulse width modulated gate signal. Consequently, the frequency of the total output voltage signal at the output of the power stage 440 is a product of the frequency of the pulse width modulated gate signal and at least twice the number of bridge amplifiers in the power stage 440. By way of example, in the embodiment depicted in FIG. 4, the power stage 440 includes three bridge amplifiers. Accordingly, the frequency of the total output voltage signal at the output of the power stage 440 is a product of the frequency of pulse width modulated gate signal and twice the number of bridge amplifiers, which in the present example is six. For ease of understanding, the frequency of the output voltage signal is graphically represented in FIGS. 5 and 6.

Moreover, since the bridge amplifiers 402, 404, 406 are connected in series, the total output voltage of the power stage 440 is a sum of the DC voltages supplied by each of the DC voltage sources 410, 412, 414. By way of example, if it is desirable for each DC voltage source to supply a DC voltage of about 800 volts to a corresponding bridge amplifier, the total output voltage of the power stage 440 may swing from about −2400 volts to about +2400 volts across the power stage 440. Since all the bridge amplifiers 402, 404, 406 are configured to use substantially similar transistor modules that operate at substantially similar DC voltages, design and manufacture costs of the gradient amplifier system 100 (see FIG. 1) may be significantly reduced without compromising the performance of the system 100.

Figure 5:
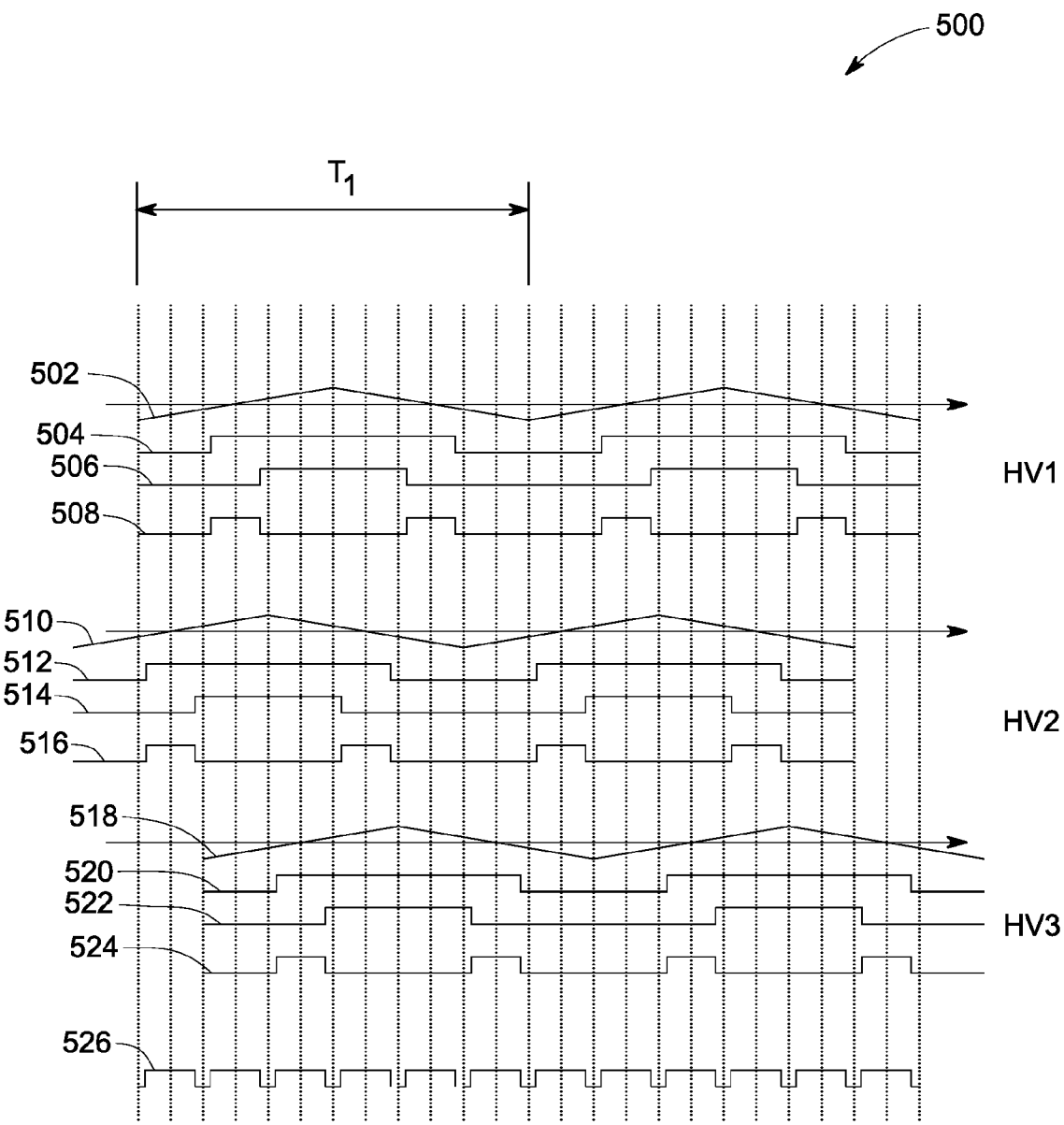
FIG. 5 is a graphical representation of an output voltage of the power stage of FIG. 4, in accordance with aspects of the present technique.

Turning now to FIG. 5, a graphical representation 500 of an output voltage of a power stage, such as the power stage 440 (see FIG. 4) in accordance with aspects of the present technique, is illustrated. In particular, FIG. 5 graphically illustrates a relationship between a carrier signal and output voltages across the three bridge amplifiers 402 (HV1), 404 (HV2), 406 (HV3) of FIG. 4. Plot 502 represents the carrier waveform/signal that is employed in a pulse width modulation scheme for generating the pulse width modulated gate signal. Furthermore, plot 504 is representative of the pulse width modulated gate signal applied to the left leg of the first bridge amplifier 402. Similarly, plot 506 represents the pulse width modulated gate signal, with a determined time delay, that is applied to the right leg of the first bridge amplifier 402. Moreover, plot 508 is indicative of an output voltage of the first bridge amplifier 402. The output voltage of the first bridge amplifier 402 is a modulated output voltage, as depicted by plot 508. Particularly, the pulse width modulated gate signal is applied to the left leg and the right leg of the first bridge amplifier 402 so as to obtain the modulated output voltage 508 at the output terminal of the first bridge amplifier 402.

In a similar manner, plots 510 and 518 respectively represent the carrier waveforms/signals corresponding to the second and third bridge amplifiers 404 (HV2) and 406 (HV3). Further, plots 512 and 520 respectively represent the pulse width modulated gate signals applied to the left legs of the second and third bridge amplifiers 404 and 406. Plots 514 and 522 respectively represent the pulse width modulated gate signals applied to the right legs of the second and third bridge amplifiers 404 and 406. Moreover, plots 516 and 524 respectively represent output voltages across the second and third bridge amplifiers 404, 406. Additionally, since the bridge amplifiers 402, 404, 406 are connected in series, the total output voltage of the power stage 440 (see FIG. 4), represented by plot 526, is obtained by adding individual output voltages across each of the bridge amplifiers 402, 404, 406 that are represented by plots 508, 516, 524. In accordance with aspects of the present technique, the pulse width modulated gate signals are applied to the bridge amplifiers 402, 404, 406 in such a way that only one bridge amplifier in the power stage generates an output voltage at a given instance of time. The timing of the pulse width modulated gate signal to each bridge amplifier is controlled by control logic implemented in a controller stage such as the controller stage 202 (see FIG. 2).

In addition, as previously noted with reference to FIG. 4, each bridge amplifier includes at least two legs. Further, in a time period $T_1$, each leg in the bridge amplifiers conducts based on a corresponding pulse width modulated gate signal. Since both the legs in each bridge amplifier are conducting in the time period $T_1$, the frequency at the output of each bridge amplifier is twice the frequency of the pulse width modulated gate signal. Thus, the frequency of the total output voltage at the output of the power stage is a multiple of the frequency of the pulse width modulated gate signal and at least twice the number of bridge amplifiers 402, 404, 406 included in the power stage, as depicted in plot 526. By way of example, if the frequency of the pulse width modulated is $f_{pwm}$ and three bridge amplifiers are employed in the power stage, the frequency $f_{total}$ of the total output voltage signal may be represented as:

$$f_{total}=6*f_{pwm} \qquad (1)$$

Figure 6:
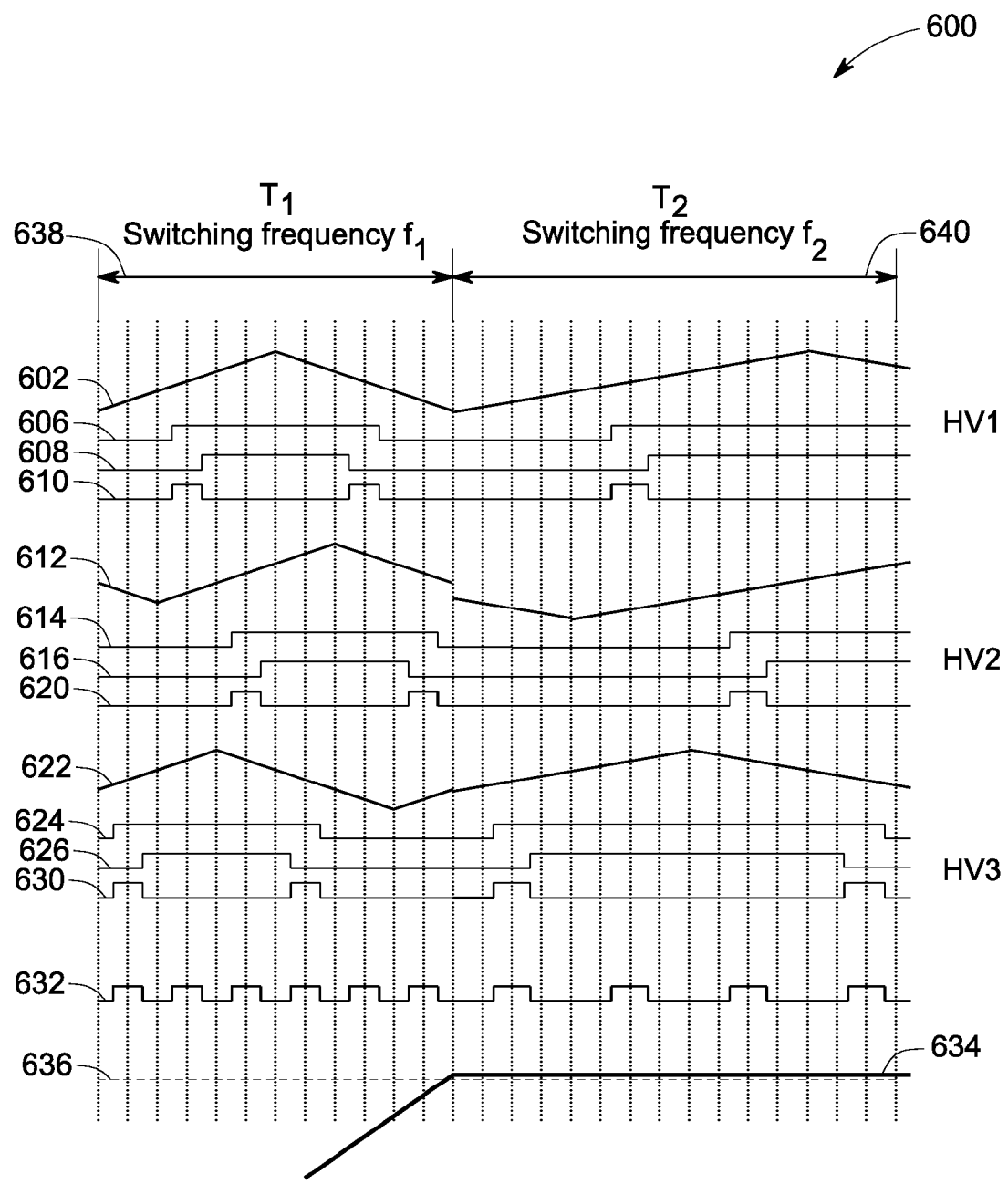
FIG. 6 is a graphical representation of an output voltage of the power stage of FIG. 4 under different switching frequencies and a varying reference current signal, in accordance with aspects of the present technique.

FIG. 6 is a graphical representation 600 of an output voltage of a power stage, such as the power stage 440 (see FIG. 4) at different switching frequencies and a varying reference current signal, in accordance with aspects of the present technique. Plots 602, 612, 622 are representative of carrier waveforms/signals with different time delays. Further, plot 606 represents a pulse width modulated gate signal applied to a left leg of the first bridge amplifier 402 (see FIG. 4), while plot 608 represents the pulse width modulated gate signal applied to a right leg of the first bridge amplifier 402. In accordance with exemplary aspects of the present technique, the pulse width modulated gate signals are applied to each leg of the first bridge amplifier 402 at different time periods such that the output voltage across the first bridge amplifier 402 is obtained only when one of the two pulse width modulated gate signals 606, 608 is in a high state or ON state. The output voltage across the first bridge amplifier 402 is generally represented by plot 610. Further, plots 614 and 624 respectively represent the pulse width modulated gate signals applied to the left legs of the second and third bridge amplifiers 404 and 406. Also, plots 616 and 626 respectively represent the pulse width modulated gate signals applied to the right legs of the second and third bridge amplifiers 404 and 406. Furthermore, plots 620 and 630 respectively represent output voltages across the second and third bridge amplifiers 404 and 406. As previously noted with reference to FIG. 5, since the bridge amplifiers are connected in series, the total output voltage 632 of the power stage is obtained by adding individual output voltages 610, 620, 630 across each of the bridge amplifiers 402, 404, and 406.

With continuing reference to FIG. 6, during the time period $T_1$ 638, the amplitude level of a reference current signal 634 is below a determined level 636, and the slew rate is also below a determined threshold rate. Thus, during the time period $T_1$, each of the bridge amplifiers 402, 404, 406 may operate at a first switching frequency $f_1$. In one embodiment, irrespective of the amplitude level of the reference current signal 634, each of the bridge amplifiers 402, 404, 406 may also operate at the first switching frequency $f_1$ if the slew rate of the reference current signal 634 is above the determined threshold rate.

Also as depicted in FIG. 6, during a time period $T_2$ 640, the reference current signal 634 reaches a flat top portion. It may be noted that for a duration of this flat top portion of the reference current signal 634, the slew rate of the reference current signal 634 is below the determined threshold rate and the amplitude level of the reference current signal 634 is above or equal to the determined level 636. Thus, during this time period $T_2$ 640, the pulse width modulated gate signal switches the operating frequency of each of the bridge amplifiers 402, 404, 406 from the first switching frequency $f_1$ to the second switching frequency $f_2$. This change in the operating frequency of each of the bridge amplifiers from the first switching frequency $f_1$ to the second switching frequency $f_2$ substantially reduces the power loss in the gradient amplifier system such as the gradient amplifier system 100 (see FIG. 1). Particularly, the power loss is reduced during the time period $T_2$ 640 as a low voltage is required across the gradient coil to produce a desired magnetic field.

Figure 7:
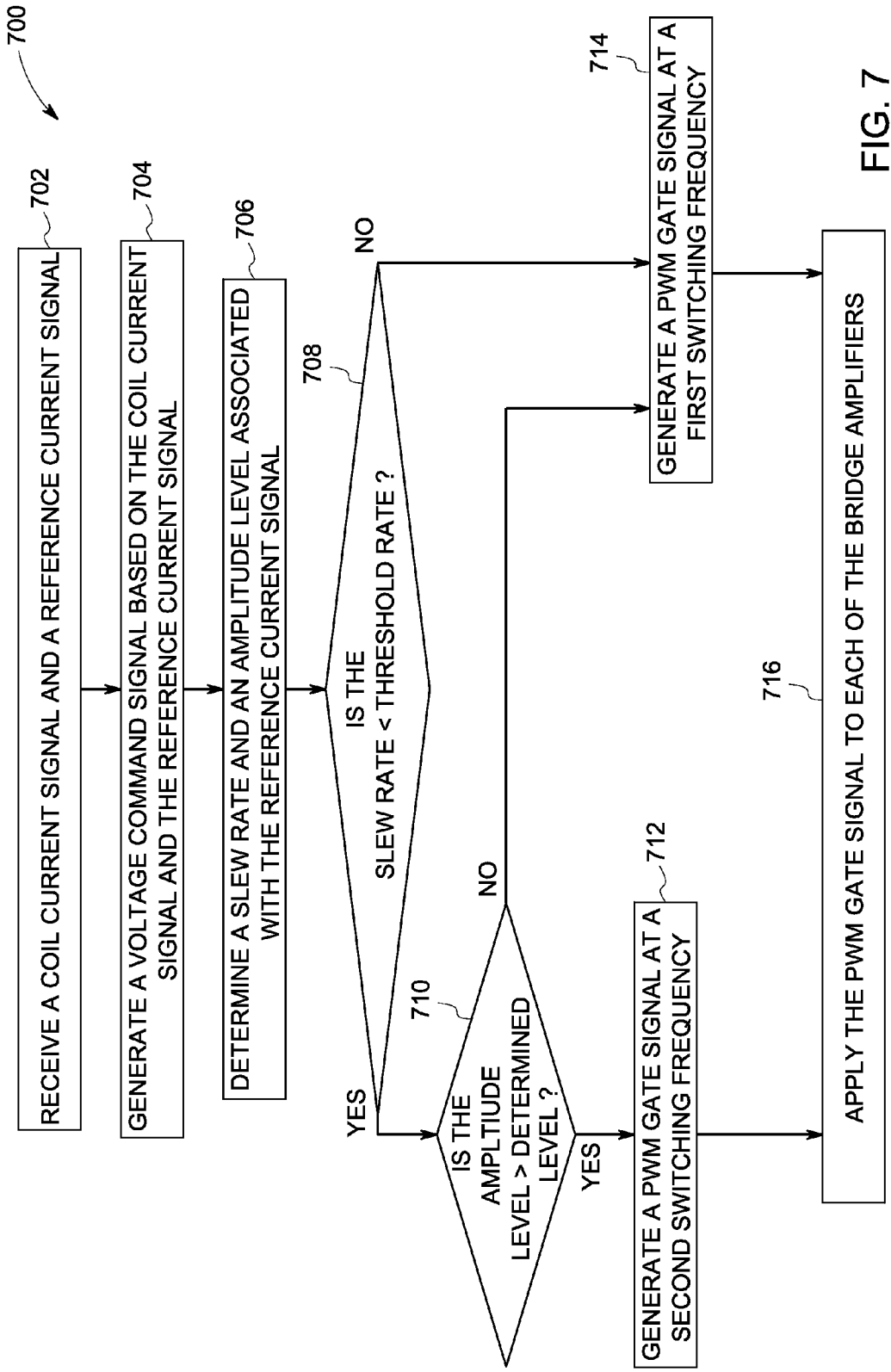
FIG. 7 is a flow chart illustrating a method for controlling the gradient amplifier system, in accordance with aspects of the present technique.

Referring now to FIG. 7, a flow chart 700 illustrating a method for controlling a gradient amplifier system, such as the gradient amplifier system 100 of FIG. 1, in accordance with aspects of the present technique, is depicted. For ease of understanding of the present technique, the method is described with reference to the components of FIG. 3. The method begins at a step 702, where a coil current signal such as the coil current signal 310 (see FIG. 3) and a reference current signal such as the reference current signal 312 (see FIG. 3) are received by the gradient amplifier system. Particularly, the command generator 304 (see FIG. 3) in the controller stage 300 receives the reference current signal 312 and the coil current signal 310. The coil current signal 310 is received as a feedback current signal from a node connecting an output terminal of a power stage to a gradient coil (see FIG. 2). Further, as previously noted, the reference current signal 312 may be received from an external source and is employed to control the magnetic field across the gradient coil 312 (see FIG. 2).

Subsequently, at step 704, the command generator 304 generates a voltage command signal 314 based on the received coil current signal 310 and the reference current signal 312. Furthermore at step 706, the analyzer 306 in the controller stage 300 receives the reference current signal 312 and determines a slew rate and an amplitude level associated with the reference current signal 312. The slew rate and the amplitude level of the reference current signal 312 may change randomly depending upon the voltage or magnetic field desired across the gradient coil 112. Also, as previously noted, the slew rate and the amplitude level of the reference current signal 312 may be determined concurrently with the generation of the pulse width modulated gate signal. Alternatively, the slew rate and the amplitude level of the reference current signal 312 may also be determined before or after the generation of the voltage command signal 314.

Also, at step 708, the pulse width modulator 308 verifies whether the slew rate is below a determined threshold rate. Particularly, at step 708 if it is determined that the slew rate of the reference current signal 312 is below the determined threshold rate, a further check is carried out to verify whether the amplitude level of the reference current signal 312 is greater than a determined level, as indicated by step 710. At step 710, if it is determined that the amplitude level of the reference current signal 312 is greater than the determined level, a pulse width modulated gate signal at a second switching frequency is generated, as depicted by step 712. However, at step 710, if it is determined that the amplitude level of the reference current signal 312 is less than the determined level, a pulse width modulated gate signal at a first switching frequency is generated, as indicated by step 714.

With returning reference to step 708, if it is determined that the slew rate of the reference current signal 312 is greater than the determined threshold rate, the pulse width modulated gate signal is generated at the first switching frequency, as depicted by step 714. Consequent to the generation of the pulse width modulated gate signal either at the first switching frequency (step 714) or the second switching frequency (step 712), the controller stage 300 applies the pulse width modulated gate signal to each of the bridge amplifiers, as depicted by step 716. Also, in certain embodiments, the pulse width modulator 308 in the controller stage 300 is configured to perform the steps 708-716.

Based on the slew rate and the amplitude level of the reference current signal 312, the applied pulse width modulated gate signal may change the operating frequency of each of the bridge amplifiers. By changing the operating frequency according to the slew rate and the amplitude level of the reference current signal 312, power loss and thermal stress in the gradient amplifier system may be substantially reduced.

Figure 8:
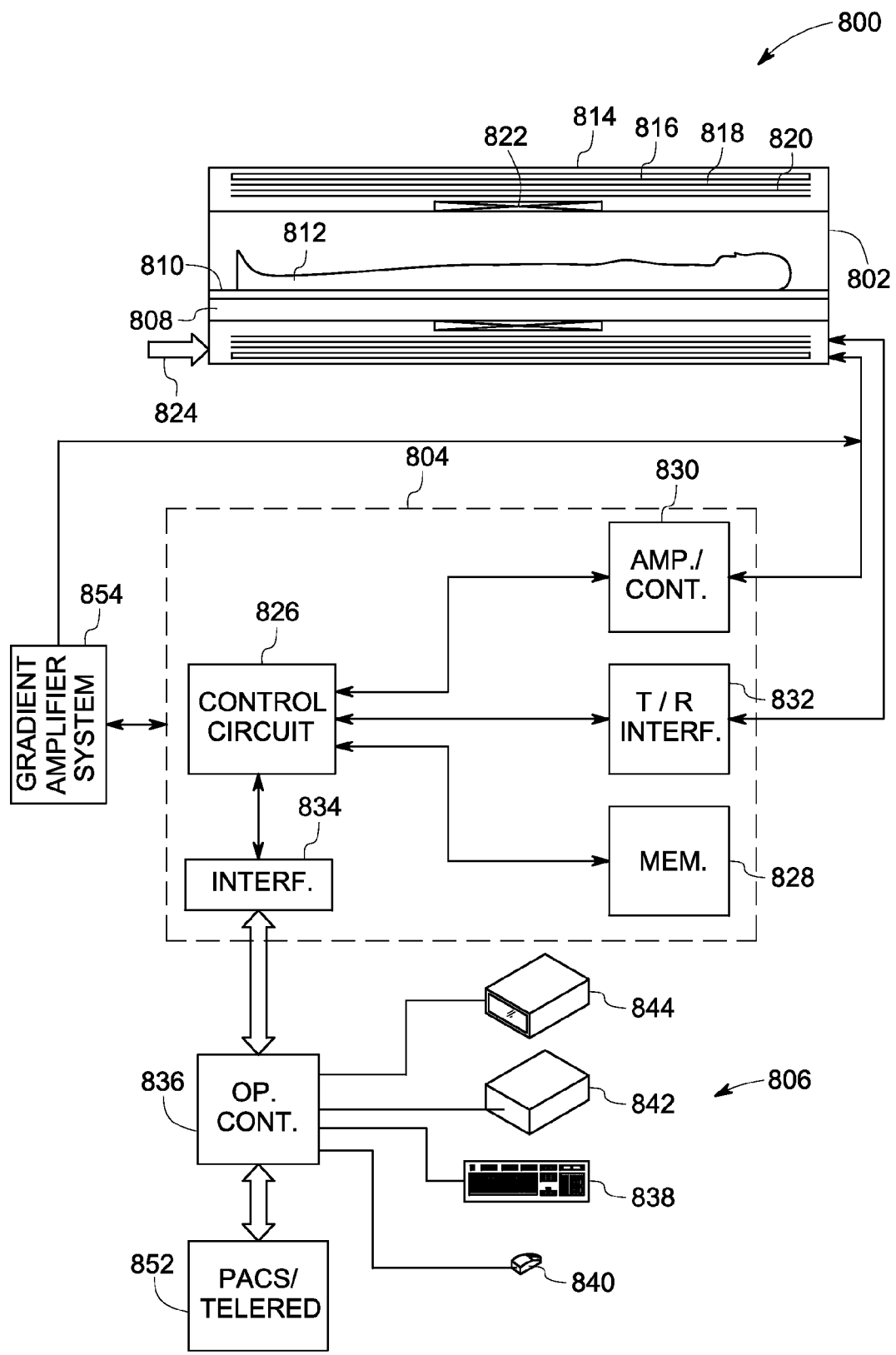
FIG. 8 is a block diagram illustrating a magnetic resonance imaging (MRI) system employing the gradient amplifier system of FIG. 1, in accordance with aspects of the present technique.

FIG. 8 is a block diagram 800 illustrating an MRI system that includes the exemplary gradient amplifier system 100 (see FIG. 1), in accordance with aspects of the present technique. The MRI system 800 is illustrated diagrammatically as including a scanner 802, scanner control circuitry 804, and system control circuitry 806. While the MRI system 800 may include any suitable MRI scanner or detector, in the illustrated embodiment the system includes a full body scanner including a patient bore 808 into which a table 810 may be positioned to place a patient 812 or any suitable object in a desired position for scanning. The scanner 802 may be of any suitable type of rating, including scanners varying from 0.5 Tesla ratings to 3 Tesla ratings and beyond.

Additionally, the scanner 802 may include a series of associated coils for producing controlled magnetic fields, for generating radio-frequency (RF) excitation pulses, and for detecting emissions from gyromagnetic material within the patient 812 in response to such pulses. In the diagrammatical view of FIG. 8, a primary magnet coil 814 may be provided for generating a primary magnetic field generally aligned with the patient bore 808. A series of gradient coils 816, 818, 820 may be grouped in a coil assembly for generating controlled magnetic gradient fields during examination sequences. A radio frequency (RF) coil 822 may be provided for generating radio frequency pulses for exciting the gyromagnetic material. In the embodiment illustrated in FIG. 8, the RF coil 822 also serves as a receiving coil. Thus, the RF coil 822 may be coupled with driving and receiving circuitry in passive and active modes for receiving emissions from the gyromagnetic material and for applying RF excitation pulses, respectively. Alternatively, various configurations of receiving coils may be provided separate from the RF coil 822. Such coils may include structures specifically adapted for target anatomies, such as head coil assemblies, and so forth. Moreover, receiving coils may be provided in any suitable physical configuration, including phased array coils, and so forth.

In a presently contemplated configuration, the gradient coils 816, 818, 820 may have different physical configurations adapted to their function in the MRI system 800. The coils 816, 818, 820 include conductive wires, bars or plates that are wound or cut to form a coil structure that generates a gradient field upon application of control pulses as described below. The placement of the coils 816, 818, 820 within the gradient coil assembly may be done in several different orders. In one embodiment, a Z-axis coil may be positioned at an innermost location, and may be formed generally as a solenoid-like structure that has relatively little impact on the RF magnetic field. Thus, in the illustrated embodiment, the gradient coil 820 is the Z-axis solenoid coil, while the coils 816 and 818 are Y-axis and X-axis coils respectively.

The coils of the scanner 802 may be controlled by external circuitry to generate desired fields and pulses and to read signals from the gyromagnetic material in a controlled manner. It may be noted that, when the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, an RF frequency pulse is generated at or near the Larmor frequency of the material of interest, resulting in rotation of the net aligned moment to produce a net transverse magnetic moment. This transverse magnetic moment precesses around the main magnetic field direction, emitting RF signals that are detected by the scanner 802 and processed for reconstruction of the desired image.

Furthermore, the gradient coils 816, 818, 820 may be configured to facilitate generation of precisely controlled magnetic fields, the strength of which vary over a predefined field of view, typically with positive and negative polarity. When each coil is energized with known electric current, the resulting magnetic field gradient is superimposed over the primary field and produces a desirably linear variation in the Z-axis component of the magnetic field strength across the field of view. The field varies linearly in one direction, but is homogenous in the other two. The three coils 816, 818, 820 have mutually orthogonal axes for the direction of their variation, enabling a linear field gradient to be imposed in an arbitrary direction with an appropriate combination of the three gradient coils 816, 818, 820.

Moreover, the pulsed gradient fields perform various functions integral to the imaging process. Some of these functions are slice selection, frequency encoding and phase encoding. These functions may be applied along the X-axis, Y-axis and Z-axis of the original coordinate system or along other axes determined by combinations of pulsed currents applied to the individual field coils.

Also, the slice select gradient determines a slab of tissue or anatomy to be imaged in the patient. The slice select gradient field may be applied simultaneously with a frequency selective RF pulse to excite a known volume of spins within a desired slice that precess at the same frequency. The slice thickness is determined by the bandwidth of the RF pulse and the gradient strength across the field of view.

The frequency encoding gradient is also known as the readout gradient, and is usually applied in a direction perpendicular to the slice select gradient. In general, the frequency encoding gradient is applied before and during the formation of the magnetic resonance (MR) echo signal resulting from the RF excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction may be accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction.

In addition, a great number of variations may be devised for pulse sequences employing the exemplary gradient pulse functions described hereinabove as well as other gradient pulse functions not explicitly described here. Moreover, adaptations in the pulse sequences may be made to appropriately orient both the selected slice and the frequency and phase encoding to excite the desired material and to acquire resulting MR signals for processing.

The coils of the scanner 802 are controlled by scanner control circuitry 804 to generate the desired magnetic field and RF pulses. In the diagrammatical view of FIG. 8, the control circuitry 804 thus includes a control circuit 826 for commanding the pulse sequences employed during the examinations, and for processing received signals. The control circuit 826 may include any suitable programmable logic device, such as a CPU or digital signal processor of a general purpose or application-specific computer. Also, the control circuit 826 is communicatively coupled to memory circuitry 828, such as volatile and non-volatile memory devices for storing physical and logical axis configuration parameters, examination pulse sequence descriptions, acquired image data, programming routines, and so forth, used during the examination sequences implemented by the scanner.

Interface between the control circuit 826 and the coils of the scanner 802 is managed by amplification and control circuitry 830 and by transmission and receive interface circuitry 832. The amplification and control circuitry 830 includes amplifiers for each gradient field coil to supply drive current to the field coils in response to control signals from control circuit 826. In certain embodiments, the MRI system 800 may include an exemplary gradient amplifier system 854 such as the gradient amplifier system 100 of FIG. 1. The gradient amplifier system 854 may be operationally coupled to the control circuitry 804, in one embodiment. However, in certain other embodiments, the control circuitry 804 may include the gradient amplifier system 854. The transmit/receive (T/R) interface circuitry 832 includes additional amplification circuitry for driving the RF coil 822. Moreover, where the RF coil 822 serves both to emit the RF excitation pulses and to receive MR signals, the T/R interface circuitry 832 may typically include a switching device for toggling the RF coil 822 between active or transmitting mode and passive or receiving mode. A power supply, denoted generally by reference numeral 824 in FIG. 8, is provided for energizing the primary magnet 814. Finally, the control circuitry 804 may include interface components 834 for exchanging configuration and image data with the system control circuitry 806. It should be noted that, while in the present description reference is made to a horizontal cylindrical bore imaging system employing a superconducting primary field magnet assembly, the present technique may also be applied to various other configurations, such as scanners employing vertical fields generated by superconducting magnets, permanent magnets, electromagnets or combinations of these means.

The system control circuitry 806 may include a wide range of devices for facilitating interface between an operator or radiologist and the scanner 802 via the scanner control circuitry 804. In the illustrated embodiment, for example, an operator controller 836 is provided in the form of a computer workstation employing a general purpose or application-specific computer. The workstation 836 also typically includes memory circuitry for storing examination pulse sequence descriptions, examination protocols, user and patient data, image data, both raw and processed, and so forth. Further, the workstation 836 may further include various interface and peripheral drivers for receiving and exchanging data with local and remote devices. In the illustrated embodiment, such devices include a conventional computer keyboard 838 and an alternative input device such as a mouse 840. A printer 842 may be provided for generating hard copy output of documents and images reconstructed from the acquired data. Moreover, a computer monitor 844 may be provided for facilitating operator interface. In addition, the system 800 may include various local and remote image access and examination control devices, represented generally by reference numeral 852 in FIG. 8. Such devices may include picture archiving and communication systems (PACS), teleradiology systems, and the like.

The method and systems described hereinabove aid in reducing power loss in a gradient amplifier system. Also, the power loss may be evenly distributed across the bridge amplifiers as each of the bridge amplifiers in the power stage is operating at substantially similar switching frequencies and DC voltages. In addition, since substantially similar DC voltage sources and bridge amplifiers are used, design cost and manufacture cost of the gradient amplifier system are substantially reduced.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A gradient amplifier system, comprising:
   a power stage comprising a plurality of bridge amplifiers, wherein each of the plurality of bridge amplifiers operates at a first switching frequency;
   a gradient coil coupled to an output terminal of the power stage and configured to produce a magnetic field proportional to a coil current signal supplied by the power stage;
   a controller stage coupled to an input terminal of the power stage and configured to:
     generate a pulse width modulated gate signal based on the coil current signal and a reference current signal, wherein the pulse width modulated gate signal is generated at a second switching frequency upon occurrence of:
       a slew rate associated with the reference current signal is below a determined threshold rate; and
       an amplitude level associated with the reference current signal is above a determined level; and
     apply the generated pulse width modulated gate signal to the power stage for changing an operating frequency of each of the plurality of bridge amplifiers from the first switching frequency to the second switching frequency.

2. The gradient amplifier system of claim 1, wherein the controller stage is configured to generate the pulse width modulated gate signal at the first switching frequency when the slew rate associated with the reference current signal is above the determined threshold rate.

3. The gradient amplifier system of claim 1, wherein the controller stage is configured to generate the pulse width modulated gate signal at the first switching frequency when:
   the slew rate associated with the reference current signal is below the determined threshold rate; and
   the amplitude level associated with the reference current signal is below the determined level.

4. The gradient amplifier system of claim 1, wherein the second switching frequency is less than the first switching frequency.

5. The gradient amplifier system of claim 1, wherein the plurality of bridge amplifiers in the power stage comprises at least a first bridge amplifier, a second bridge amplifier, and a third bridge amplifier coupled together in series.

6. The gradient amplifier system of claim 5, wherein each of the bridge amplifiers in the power stage is operationally coupled to a corresponding direct current voltage source to generate an voltage signal at the output terminal of the power stage.

7. The gradient amplifier system of claim 6, wherein the power stage is configured to generate the voltage signal by modulating a direct current voltage signal received from each of the plurality of bridge amplifiers based on the pulse width modulated gate signal applied to a corresponding bridge amplifier before providing the voltage signal to the gradient coil.

8. The gradient amplifier system of claim 7, wherein the voltage signal is modulated at a frequency that is a multiple of one of the first switching frequency and the second switching frequency and at least twice a number of bridge amplifiers in the power stage.

9. The gradient amplifier system of claim 1, further comprising a current sensor coupled to the gradient coil and configured to:
  sense the coil current signal at the gradient coil; and
  communicate the sensed coil current signal to the controller stage.

10. The gradient amplifier system of claim 1, wherein the controller stage comprises:
  a command generator configured to generate a voltage command signal based on the coil current signal and the reference current signal;
  an analyzer configured to determine the slew rate and the amplitude level associated with the reference current signal; and
  a pulse width modulator coupled to the command generator and the analyzer and configured to generate the pulse width modulated gate signal by modulating the voltage command signal based on the slew rate and the amplitude level associated with the reference current signal.

11. A method for controlling a gradient amplifier system, the method comprising:
  receiving a coil current signal from an output terminal of a power stage comprising a plurality of bridge amplifiers operating at a first switching frequency;
  receiving a reference current signal for controlling a magnetic field across a gradient coil;
  generating a pulse width modulated gate signal based on the coil current signal and the reference current signal, wherein the pulse width modulated gate signal is generated at a second switching frequency when:
    a slew rate associated with the reference current signal is below a determined threshold rate; and
    an amplitude level associated with the reference current signal is above a determined level; and
  applying the pulse width modulated gate signal to the power stage for changing an operating frequency of each of the plurality of bridge amplifiers from the first switching frequency to the second switching frequency.

12. The method of claim 11, wherein receiving the coil current signal comprises sensing the coil current signal at a node that connects the output terminal of the power stage to the gradient coil.

13. The method of claim 11, further comprising generating the pulse width modulated gate signal at the first switching frequency when:
  the slew rate associated with the reference current signal is below the determined threshold rate; and
  the amplitude level associated with the reference current signal is below the determined level.

14. The method of claim 11, further comprising generating the pulse width modulated gate signal at the first switching frequency when the slew rate associated with the reference current signal is above the determined threshold rate.

15. The method of claim 11, wherein generating the pulse width modulated gate signal comprises:
  identifying an error current signal by comparing the coil current signal with the reference current signal, wherein the error current signal is indicative of a deviation of the coil current signal from the reference current signal;
  generating a proportional integral voltage corresponding to the error current signal;
  determining at least an inductive voltage and a resistive voltage across the gradient coil; and
  generating the pulse width modulated gate signal based on at least the proportional integral voltage, the inductive voltage, and the resistive voltage across the gradient coil.

16. The method of claim 15, wherein generating the pulse width modulated gate signal further comprises:
  summing at least the proportional integral voltage, the inductive voltage, and the resistive voltage to generate a voltage command signal;
  dividing the voltage command signal based on a number of bridge amplifiers in the power stage; and
  modulating the divided voltage command signal based on a pulse width modulation scheme to generate the pulse width modulated gate signal.

17. The method of claim 11, further comprising operating each of the plurality of bridge amplifiers at the first switching frequency when at least one of:
  the slew rate associated with the reference current signal is above the determined threshold rate; and
  the slew rate associated with the reference current signal is below the determined threshold rate, and the amplitude level associated with the reference current signal is below the determined level.

18. The method of claim 11, further comprising operating each of the plurality of bridge amplifiers at the second switching frequency when:
  the slew rate associated with the reference current signal is below the threshold rate; and
  the amplitude level associated with the reference current signal is above the determined level.

19. A controller stage for controlling a gradient amplifier system, the controller stage comprising:
  a command generator configured to generate a voltage command signal based on a coil current signal and a reference current signal;
  an analyzer configured to determine a slew rate and an amplitude level associated with the reference current signal; and
  a pulse width modulator coupled to the command generator and the analyzer and configured to modulate the voltage command signal based on the slew rate and the amplitude level associated with the reference current signal.

20. The controller stage of claim 19, further configured to modulate the voltage command signal to generate a pulse width modulated gate signal at a first switching frequency when the slew rate associated with the reference current signal is below a determined threshold rate, and the amplitude level associated with the reference current signal is below a determined level.

21. The controller stage of claim 19, further configured to modulate the voltage command signal to generate a pulse width modulated gate signal at a first switching frequency when the slew rate associated with the reference current signal is above a threshold rate.

22. The controller stage of claim 21, further configured to modulate the voltage command signal to generate the pulse width modulated gate signal at a second switching frequency when the slew rate associated with the reference current signal is below the determined threshold rate and the amplitude level associated with the reference current signal is above the determined level.

23. The controller stage of claim 19, wherein the command generator further comprises:
  a differential unit configured to:

receive the coil current signal and the reference current signal;

generate an error current signal by comparing the coil current signal with the reference current signal;

a proportional integral control unit coupled to the differential unit and configured to generate a proportional integral voltage corresponding to the error current signal;

a coil model unit configured to determine at least an inductive voltage and a resistive voltage across a gradient coil based on the reference current signal; and a summing unit configured to generate the voltage command signal by combining at least the proportional integral voltage, the inductive voltage, and the resistive voltage.

24. The controller stage of claim 23, wherein the summing unit further comprises a dividing unit configured to divide the voltage command signal based on a number of bridge amplifiers in the gradient amplifier system.

25. A system for magnetic resonance imaging, comprising:

scanner control circuitry configured to acquire image data, wherein the scanner control circuitry comprises:

a gradient coil configured to produce magnetic fields for localizing the imaging data;

a gradient amplifier system coupled to the gradient coil and configured to supply a coil current signal to the gradient coil, wherein the gradient amplifier system comprises:

a power stage comprising a plurality of bridge amplifiers, wherein each of the plurality of bridge amplifiers operates at a first switching frequency;

a controller stage coupled to an input terminal of the power stage and configured to:

generate a pulse width modulated gate signal based on the coil current signal and a reference current signal, wherein the pulse width modulated gate signal is generated at a second switching frequency when:

a slew rate associated with the reference current signal is below a determined threshold rate;

an amplitude level associated with the reference current signal is above a determined level;

apply the generated pulse width modulated gate signal to the power stage for changing an operating frequency of each of the plurality of bridge amplifiers from the first switching frequency to the second switching frequency; and system control circuitry in operative association with the scanner control circuitry and configured to process the acquired image data.

* * * * *